(12) United States Patent
Morrill

(10) Patent No.: US 6,198,308 B1
(45) Date of Patent: Mar. 6, 2001

(54) CIRCUIT FOR DYNAMIC SWITCHING OF A BUFFER THRESHOLD

(75) Inventor: David P. Morrill, Scarborough, ME (US)

(73) Assignee: Fairchild Semiconductor Corp., South Portland, ME (US)

( * ) Notice: Subject to any disclaimer, the term of this patent is extended or adjusted under 35 U.S.C. 154(b) by 0 days.

(21) Appl. No.: 09/281,465

(22) Filed: Mar. 30, 1999

(51) Int. Cl.$^7$ .............................................. H03K 19/0175
(52) U.S. Cl. ................................................ 326/83; 326/83
(58) Field of Search .................................. 326/17, 20, 23, 326/24, 26, 27, 83, 86, 87, 90, 91, 121

(56) References Cited

U.S. PATENT DOCUMENTS

| | | | |
|---|---|---|---|
| 5,541,527 | * 7/1996 | Hae-Ting Ma | 326/21 |
| 5,554,942 | * 9/1996 | Herr et al. | 326/33 |
| 5,694,065 | * 12/1997 | Hamasaki et al. | 327/108 |
| 5,736,826 | 4/1998 | Hrassky . | |
| 5,854,560 | * 12/1998 | Chow | 326/27 |
| 5,856,750 | 1/1999 | Koseki . | |
| 5,864,244 | * 1/1999 | Kaplinsky | 326/58 |
| 6,051,995 | * 4/2000 | Pollachek | 326/87 |

FOREIGN PATENT DOCUMENTS

| 07193471 | 7/1995 | (JP) . |
|---|---|---|
| WO 96/07238 | 3/1996 | (WO) . |

* cited by examiner

*Primary Examiner*—Michael Tokar
(74) *Attorney, Agent, or Firm*—Pierce Atwood; Chris A. Caseiro

(57) ABSTRACT

A buffer circuit for providing dynamic threshold control. The buffer circuit includes a pair of input inverters designed with different skewed threshold potential characteristics. The outputs of the skewed inverters are directed to a logic circuit designed to select either the faster or the slower signal received from the two inverters for transmission to passgate devices coupled to the respective inverters. Only one of the passgate devices is enabled to ensure that only one of the output signals from the two inverters is propagated through the buffer. A latch is preferably connected between the logic circuit and the two passgate devices to maintain the states of the inverters and the logic circuit. The circuit can be designed to define the threshold potential at which switching will occur so as to reduce propagation delay or increase it as desired. It is therefore possible using the circuit to increase transmission rates with minimal affect on signal noise.

13 Claims, 4 Drawing Sheets

CIRCUIT FOR DYNAMIC SWITCHING OF A BUFFER THRESHOLD

BACKGROUND OF THE INVENTION

1. Field of the Invention

The present invention relates to circuitry for adjusting the rate at which signal transitions occur. In particular, the present invention relates to buffer circuits providing faster switching. More particularly, the present invention relates to circuitry that dynamically adjusts the threshold potential at which signal transitions occur.

2. Description of the Prior Art

Input buffers are used to transfer electrical signals of desired amplitude and strength. Input buffers are used to ensure that those electrical signals are transferred as accurately and as quickly as possible. It is often the case, however, that when transmission rates increase, signal accuracy may suffer. In particular, it is well known that rapid signal transmission may be accompanied by signal bounce. That bounce is the noise or ringing associated with the undershoot and overshoot of a final steady state logic high or logic low signal that occurs in the transition between high and low. The difference in the potentials associated with a high signal and a low signal may be as small as 0.4V or as great as 5V. For Complementary Metal Oxide Semiconductor (CMOS) based logic, for example, a logic high corresponds to a nominal 5.0V potential (for a 5.0V power supply) and a nominal 3.3V potential (for a 3.3V power supply), while a logic low is essentially equivalent to ground (GND) or 0.0V.

The potentials associated with high and low signals described above are idealized values. In fact, highs and lows generally fall within a range of potentials associated with the indicated values. Thus, for a 3.3V supply, a high signal may be supplied at 2.6V, for example, while a low signal may actually be associated with a 0.7V value. It can be seen then that dynamic noise margins are reduced with lower supply potentials, whereas the basic operational characteristics of the associated active devices remain substantially the same.

In that regard, it is to be noted that in most systems, there is a single threshold potential at which the low-to-high (L-to-H) or high-to-low (H-to-L) transitions occur. For most transistor-based devices, that value is typically about one-half of the supply potential, or Vcc/2. As the potentials of the power supplies used to power circuitry move closer to GND, the signal bounce mentioned above takes on greater importance. In particular, the initial oscillation around the ultimate steady state value that occurs when the transition between high and low is triggered may vary enough to generate a false logic signal. The noise swing may be enough to cause a low signal to transition to a high-signal potential and vice-versa, or it may be variable enough that the signal is not clearly at either a high potential or a low potential. Either situation is undesirable. For that reason, it is becoming increasingly important that the transitions between high and low signal occur with less noise than has been previously experienced.

Clearly, unexpected changes in logic values are not desirable. This problem is more likely to occur as transmission rates are increased. Increasing transmission rates enables the transfer of more data in a shorter time period and so is desirable in many respects. However, the gain in increased transmission rate is often undermined by an increase in signal noise. That is, a rapid change in signal level creates an oscillation about the steady state value corresponding to the sudden switching on or off of a transistor. As transistors become increasingly smaller in order to achieve the faster transmission rates of interest, the signal bounce that occurs with the rapid switching often creates reflections in transmission media, such as telephone transmission lines where reflections will cause signal errors. This is an increasingly important concern as dynamic noise margins are reduced.

To resolve this problem, it is important to enable "gentle" switching of buffer circuits so that signal noise, including signal undershoot and overshoot, is reduced. One technique for doing that is to slow the propagation of a switching signal through the circuitry. This slows the transmission of the signal and is therefore adverse to the goal of increasing signal transmissions. While the intentional slowing of signal propagation addresses the noise issue, it also reduces transmission rates. Of course, there are a number of other factors that cause increases in signal propagation delay. They can be related to the specifics of particular circuitry, the load associated with downstream devices, external conditions, and any number of other factors. However, it is of increasing interest to minimize signal propagation delays.

As noted, the rate at which a signal propagates through circuitry including, but not limited to input buffer circuitry, relates to the threshold potential at which transistors of the buffer are turned on and off. In general for Complementary Metal-Oxide-Semiconductor (CMOS) transistor sets, state switching occurs at about one-half the value of Vcc as earlier indicated. That is, in a L-to-H transition for example, a P-type MOS (PMOS) transistor of a CMOS inverter will turn on when an input signal is at a potential of about Vcc/2. At about the same time, the N-type MOS (NMOS) transistor of that inverter will switch off at that potential. Correspondingly, the PMOS transistor is designed to shut off at about Vcc/2 during a H-to-L transition, with the NMOS turning on at about that potential. Thus, in order to trigger a signal change, it is necessary to first reach this threshold potential in either direction. The faster that is done the more the signal propagation delay is reduced. However, that is preferably done with signal noise concerns also taken into account.

U.S. Pat. No. 5,736,826 issued to Hrassky discloses a circuit designed to regulate signal propagation through hysteresis. The Hrassky circuit includes two multiplexed buffers to develop a differential comparison of two input signals. The circuit provides for selection of the particular input signal path that includes sufficient hysteresis to resolve noise concerns. While hysteresis may minimize the effects of signal bounce by regulating signal propagation, it does so in a manner that slows that propagation. That result is undesirable as accurate signal transmission at reduced signal propagation rates becomes increasingly important.

Therefore, what is needed is a buffer circuit that enables signal propagation with minimal noise problems and at reduced delay rates. What is also needed is such a buffer circuit that can be tailored to provide a modification in the threshold potential value at which signal switching occurs. Further, what is needed is a buffer circuit that allows the user to tailor selection of a particular signal transmission pathway as a function of desired propagation delay values.

SUMMARY OF THE INVENTION

It is an object of the present invention to provide a buffer circuit that enables signal propagation with minimal noise problems and at reduced delay rates. It is also an object of the present invention to provide such a buffer circuit that can be tailored to modify the threshold potential value at which signal switching occurs. Another object of the present invention is to provide a buffer circuit that allows the user to tailor selection of a particular signal transmission pathway as a function of desired propagation delay values.

These and other objects are achieved in the present invention by creating a buffer having an input branch coupled to a logic circuit, a latch subcircuit, and a pair of pass gate sets. The input branch includes a pair of inverters tailored to have skewed threshold potentials at which switching occurs. Both inverters are coupled to an input node of the buffer circuit for receiving an incoming signal to be propagated to downstream circuitry coupled to the buffer's output node. For L-to-H signal inputs the first inverter is designed to switch at some potential less than Vcc/2 while the second inverter is designed to switch at some potential greater than Vcc/2. In the buffer circuit of the present invention this ultimately results in a reduced propagation delay than would otherwise occur under standard inverter arrangements. This helps reduce sensitivity to slow input transitions. Also, the roles of the two inverters can be reversed such that the first inverter switches at the higher potential and the second at the lower in order to increase propagation delay.

The control subcircuitry of the buffer circuit of the present invention is designed to select for a L-to-H signal transmission that one of the two inverters that switches at the lower threshold potential and, for the H-to-L transmission, the other inverter having the higher threshold potential. The control subcircuitry preferably includes the logic circuit, the latch, and the pass gate sets. The logic circuit may be any sort of device including, but not limited to, an operational amplifier, a NAND gate, an AND gate, or the like. It receives at its input the signals coming from the two inverters and selects, through its output, the particular pass gate set that defines which inverter signal is actually passed through to the buffer's output node. The buffer circuit also preferably includes as part of the control subcircuitry the latch. The latch is designed to maintain the state of the buffer circuit until the input signal reaches a potential at which the other of the two inverters becomes enabled. That is, it maintains the logic circuit in an operational state in the manner to be described herein.

The combination of circuit components configured in the manner to be described in detail herein enable the faster propagation of a signal through the buffer while addressing possible noise concerns. The buffer circuit of the present invention is sufficiently flexible to allow for slower rather than faster propagation rates therethrough if desired. Moreover, enabling logic may be coupled to the control subcircuitry to generate a fast data path s a function of fast input transitions. These and other advantages of the present invention will become apparent upon review of the detailed description, the accompanying drawings, and the appended claims.

DESCRIPTION OF PREFERRED EMBODIMENT OF THE INVENTION

Figure 1:
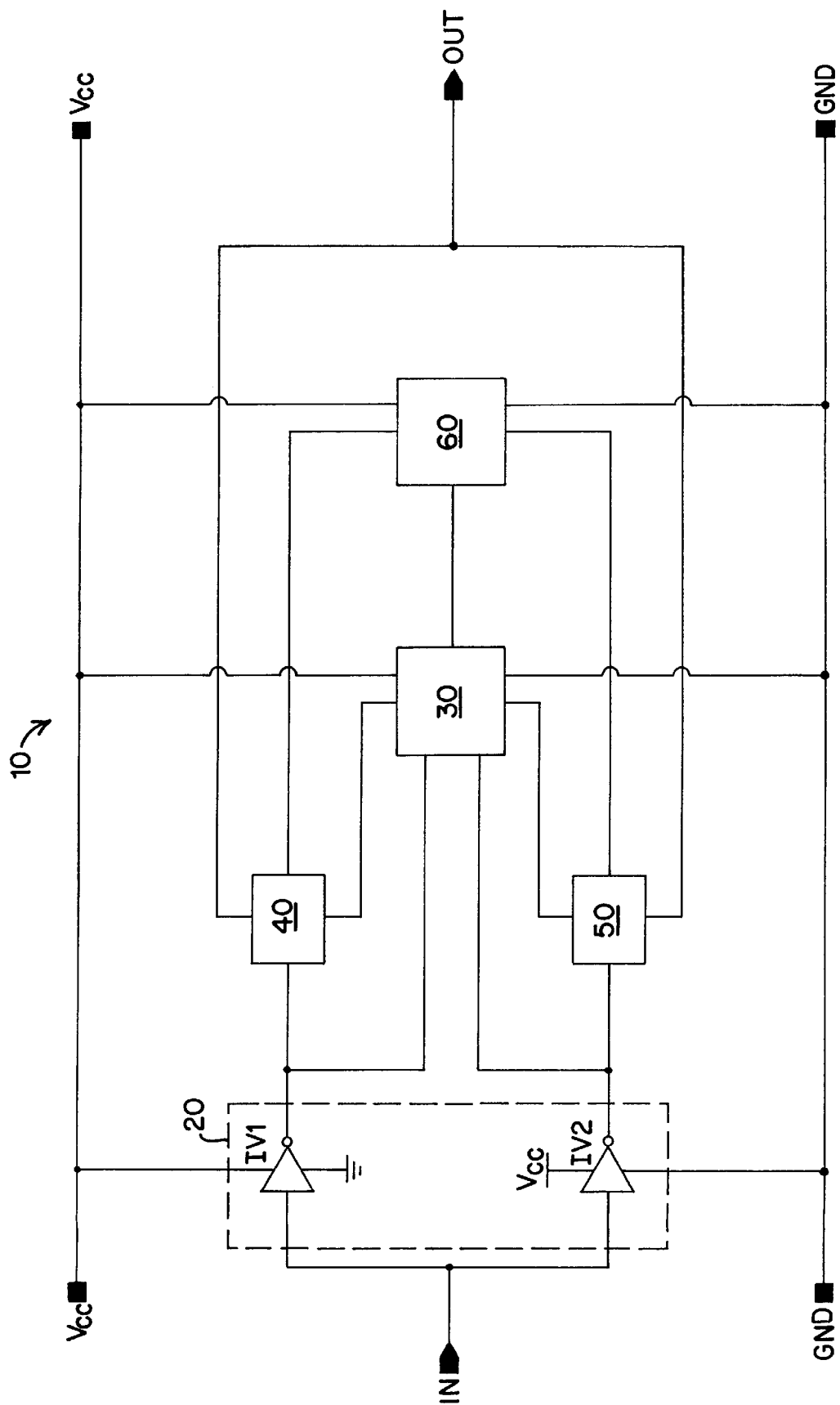
FIG. 1 is a simplified circuit diagram showing the buffer circuit of the present invention generally.

A simplified illustration of a buffer circuit 10 of the present invention having dynamic threshold control is shown in FIG. 1. The buffer circuit 10 includes an input section 20 formed of a first input device represented by first inverter IV1 and a second input device represented by inverter IV2, each of which acts essentially as a separate sub-buffer circuit. Although shown in FIG. 1 as two single inverters, it is to be understood that the first and second input devices may be formed by a set of inverters or other suitable switching devices. The first inverter IV1 and the second inverter IV2 are each supplied by a high-potential power rail Vcc and a low-potential power rail GND, with their inputs designed to receive an input signal at input node IN for transmission to extended circuitry coupled to the buffer 10 at output node OUT. The buffer circuit 10 also includes a logic circuit 30 having as inputs the outputs of the first inverter IV1 and the second inverter IV2. Supply rails Vcc and GND power the logic circuit 30. A first inverter controller 40 is coupled between the output of the first inverter IV1 and the circuit's output node OUT. It has control inputs connected to the output of the logic circuit 30 and a latching device 60. Supply rails Vcc and GND power the latching device 60. A second inverter controller 50 is coupled between the output of the second inverter IV2 and output node OUT. It too has control inputs from the logic circuit 30 and the latch device 60. Logic circuit 30 is designed to select which of the two inverter controllers is operable in a manner that permits the signal from either of first inverter IV1 and second inverter IV2 to be passed through to the output node OUT. The latch device 60 fixes the state of the non-selected inverter controller such that a signal switch at IN does not cause the buffer circuit 10 to transmit signals from inverters IV1 and IV2 simultaneously.

In the preferred mode of operation of the buffer circuit 10 wherein the ordinary buffer propagation delay is reduced, the logic circuit 30 compares the output signals from each of the inverters IV1 and IV2. It then provides to the appropriate one of the two inverter controllers a control signal enabling the controller that is coupled to the particular inverter designed to switch faster during a signal transition at IN. Since only one of the inverter controllers is enabled, only the signal from the inverter coupled to that enabled controller is permitted to propagate to OUT. The latch 60 fixes the states of the controllers and of the logic circuit 30 until such time as a signal transition occurs.

In order to ensure that both inverters IV1 and IV2 do not switch simultaneously, each is designed with a skewed threshold voltage wherein the thresholds of the two inverters are not equal. When reduced propagation delay through the buffer 10 is desired, inverter IV1 is designed with a threshold switching potential that is less than Vcc/2 while inverter IV2 is designed with a threshold switching potential that is greater than Vcc/2. In that way, a L-to-H transition at IN triggers a faster switching of the state of inverter IV1 than it does of inverter IV2. Since it switches faster, the low output signal from IV1 defines the state of the logic circuit 30 and therefore the state of the latch 60. The signals from those two components then enable the first inverter controller 40 that permits the signal from inverter IV1 to pass through to OUT before the switching of inverter IV2 is complete. The latch 60 latches the circuit devices in their switched states until the next input signal transition occurs.

For a H-to-L transition at IN, the buffer circuit 10 operates in a correspondingly similar manner. In that situation, the skewed inverter IV2 switches first to output a high signal while the signal from inverter IV1 remains low. As a result, inverter IV2 defines the state of logic circuit 30 and latch 60 such that inverter controller 40 is disabled and inverter controller 50 is enabled. The signal from inverter IV2 is therefore pass through to OUT and the states of the components of the buffer 10 remain latched until the next transition occurs. It is to be understood that in order to increase the propagation delay, the skewing of the inverters may be reversed from that indicated such that inverter IV1 switches at a threshold potential greater than Vcc/2 and inverter IV2 switches at a threshold potential less than Vcc/2. Alternatively, the couplings of the inverters to the logic circuit 30, the couplings of the latch 60 to the inverter controllers, or external logic circuitry coupled to the inverter controllers, among other techniques, may be used to define the threshold potential at which signal transitions are to be propagated. As will be seen with regard to the discussion of the preferred design of the components of the buffer 10 with respect to FIG. 2, the arrangements of those components provides for dynamic control of threshold switching potentials.

Figure 2:
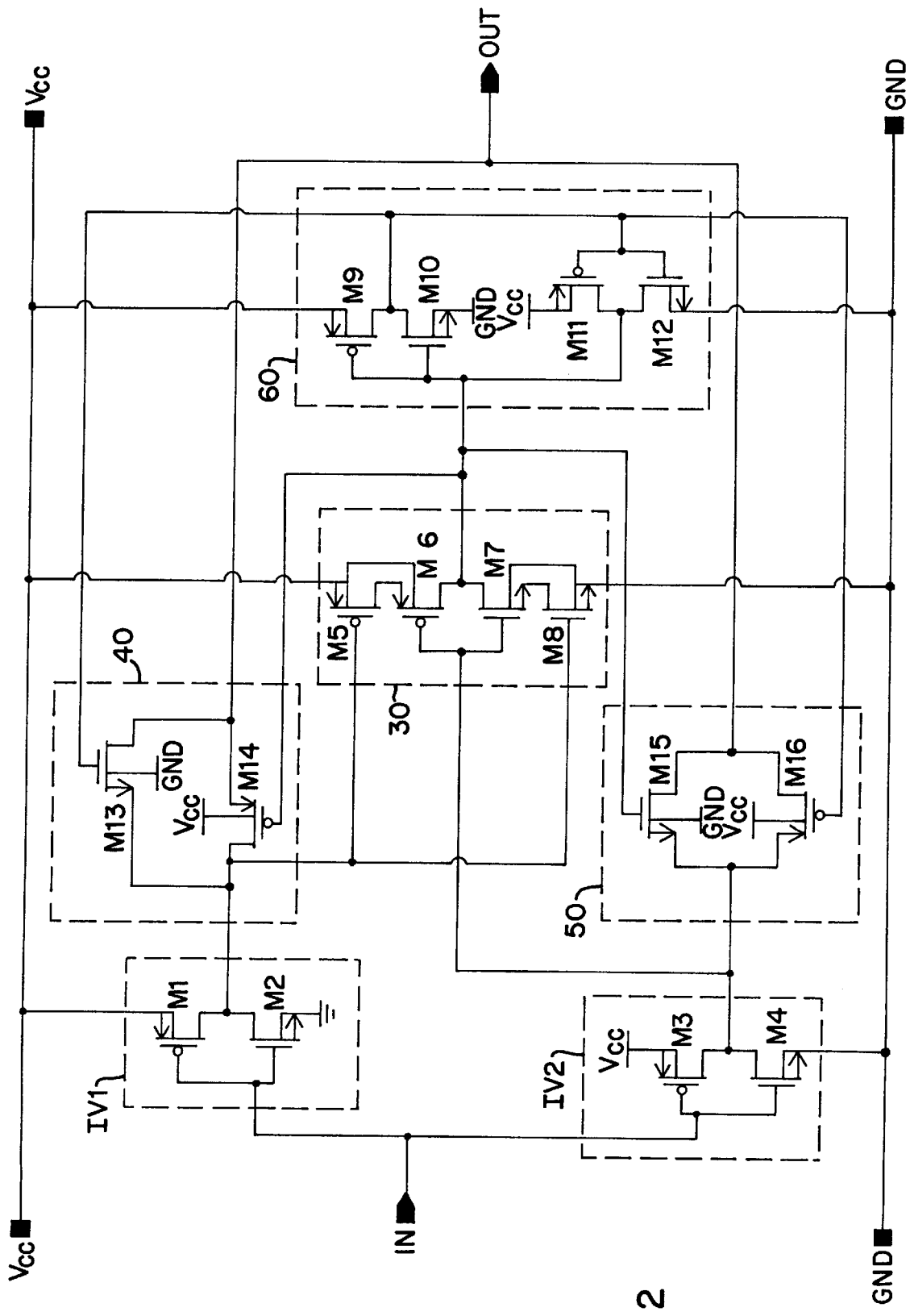
FIG. 2 is a detailed circuit diagram of a preferred design of the buffer circuit of the present invention.

As illustrated in FIG. 2, the preferred design of the buffer circuit 10 is a combination of CMOS-based devices. This design takes advantage of the desirable characteristics of such devices. As shown in that figure, the buffer circuit 10 is designed to reduce propagation delays. However, as earlier noted with respect to FIG. 1, the inverters may be designed with opposing skew characteristics, or the various components may be connected in different ways, among other techniques, to increase the propagation delay if desired.

With continuing reference to FIG. 2, the inverter IV1 is a CMOS inverter formed of PMOS transistor M1 and NMOS transistor M2. M1 has its gate coupled to IN, its source and bulk coupled to Vcc, and its drain coupled to the input of first inverter controller 40 and to the input of logic circuit 30. M2 has its gate coupled to IN, its source coupled to GND, and its drain tied to the drain of M1 as well as to the input of first inverter controller 40 and to the input of logic circuit 30. Similarly, the inverter IV2 is a CMOS inverter formed of PMOS transistor M3 and NMOS transistor M4. M3 has its gate coupled to IN, its source and bulk coupled to Vcc, and its drain coupled to the input of first inverter controller 40 and to the input of logic circuit 30. M4 has its gate coupled to IN, its source coupled to GND, and its drain tied to the drain of M3 as well as to the input of first inverter controller 40 and to the input of logic circuit 30.

Transistor M1 is preferably sized to handle more current than most standard PMOS transistors in a CMOS-inverter design in order to ensure that inverter IV1 will switch at a threshold potential greater than Vcc/2. Alternatively, transistor M2 may be sized less than the standard NMOS transistor of a CMOS-based inverter. The key in this particular arrangement is to skew the ratio of current-handling capacities of the two transistors of the inverter enough to modify the threshold potential of the inverter in a desired manner. By the same token, transistor M4 is preferably sized to handle more current than most standard NMOS transistors in a CMOS-inverter design in order to ensure that inverter IV2 will switch at a threshold potential less than Vcc/2. Alternatively, transistor M3 may be sized less than the standard PMOS transistor of a CMOS-based inverter. Again, the goal is to skew the operation of that particular inverter in the manner desired.

As can be seen in FIG. 2, the balance of the components of the buffer circuit 10 are fairly conventional. The logic circuit 30 is essentially a NAND-gate multiplexer type of design including PMOS transistors M5 and M6 and NMOS transistors M7 and M8. Transistors M5 and M6 have their bulks tied to Vcc. M5 has its source tied to Vcc, its gate coupled to the output of IV1, and its drain tied to the source of M6. M6 has its gate coupled to the output of inverter IV2 and its drain coupled to the drain of transistor M7. The potential at that location defines the state of the output of the logic circuit 30 to the latch 60 and to inputs of controllers 40 and 50. In addition to having its drain coupled to the drain of M6, transistor M7 has its gate coupled to the output of inverter IV2 and its source coupled to the drain of transistor M8. Finally, M8 has its gate coupled to the output of inverter IV1 and its source coupled to GND.

The latch 60 is a typical sort of latching device including PMOS transistors M9 and M11 and NMOS transistors M10 and M12. Transistors M9 and M11 have their sources and bulks tied to Vcc. Transistors M10 and M12 have their bulks and sources tied to GND. M9 has its gate coupled to the output of the logic circuit 30 and its drain tied to the drain of M10. M10 also has its gate coupled to the output of the logic circuit 30. In order to provide the latching of interest, M11 and M12 have their gates coupled to the drains of transistors M9 and M10 and their drains coupled to the output of the logic circuit 30. In effect, the latch 60 is formed of a pair of CMOS-based inverters the output of which is coupled to inputs of controllers 40 and 50.

Finally with reference to FIG. 2, first controller 40 is preferably formed of a pair of passgate transistors coupled in parallel between the inverter IV1 and the output node OUT. The passgate transistors include NMOS transistor M13 and PMOS transistor M14. M13 has its gate coupled to the output of the latch 60, its bulk coupled to GND, its source coupled to the output of inverter IV1, and its drain coupled to OUT. M14 has its gate coupled to the output of the logic circuit 30, its bulk coupled to Vcc, its drain coupled to the output of inverter IV1, and its source coupled to OUT. Second controller 50 is preferably also formed of a pair of passgate transistors coupled in parallel between the inverter IV2 and the output node OUT. The passgate transistors include NMOS transistor M15 and PMOS transistor M16. M15 has its gate coupled to the output of the logic circuit 30, its bulk coupled to GND, its source coupled to the output of inverter IV2, and its drain coupled to OUT. M16 has its gate coupled to the output of the latch 60, its bulk coupled to Vcc, its drain coupled to the output of inverter IV2, and its source coupled to OUT.

As an example, for a L-to-H transition at IN with inverters IV1 and IV2 having skewed thresholds as indicated, the buffer circuit of FIG. 2 operates as follows. First, because of its skew design, inverter IV2 will switch first such that its output will go low while the output of inverter IV1 remains high. The low at the output of IV2 triggers a change at the gates of transistors M6 and M7 of logic circuit 30 such that M6 will turn on and M7 will turn off. Transistors M5 and M8 will remain off and on, respectively, as the output of inverter IV1 remains high. The potential at the output of logic circuit 30 will switch from low to high, causing a turning off of transistor M14 of controller 40 and of transistor M15 of controller 50. It further causes a switching of the output of the latch 60 to a logic low, thereby turning off transistor M13 of controller 40 and a turning on of transistor M16 of controller 50. The net result is that controller 40 is disabled, halting the propagation of the signal from inverter IV1 while keeping controller 50 enabled so as to ensure that the switched signal from inverter IV2 is passed to OUT. The signal from inverter IV1 then switches; however, it is latched in that state with no throughput to OUT as controller 40 is latched in a disabled state by latch 60. In addition, the logic circuit 30 is also latched in its high output state by its coupling to the latch 60. It can be seen that a switching of the signal at IN from H-to-L reverses the process so that controller 40 is enabled with the faster switching of inverter IV1 and controller 50 is disabled. As noted, the circuit can be designed alternatively such that the controllers 40 and 50 are connected to enable logic of other circuits to generate a fast data path based on a fast input transition.

Figure 3:
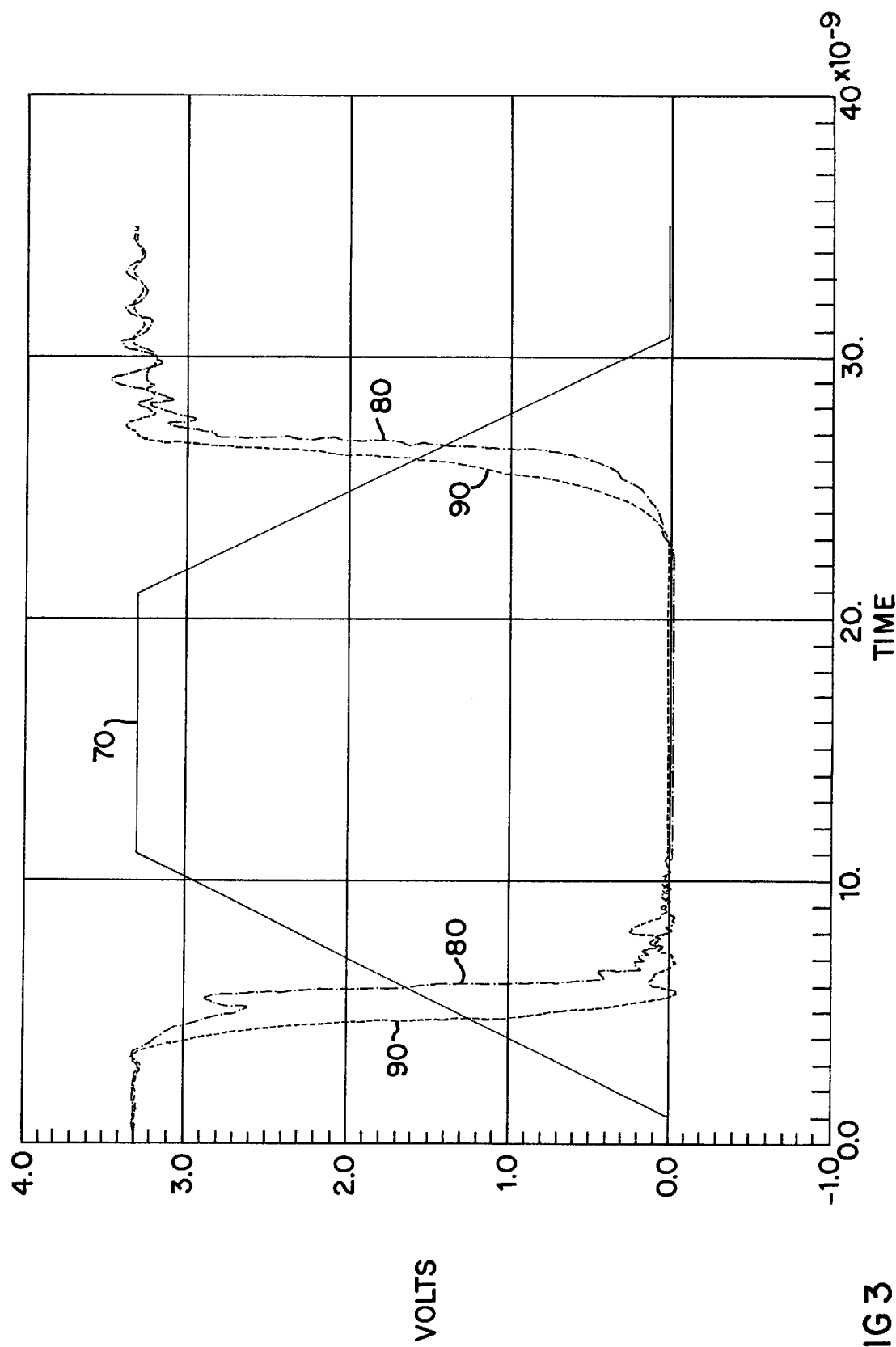
FIG. 3 is a waveform diagram showing the reduced propagation delay available with the present invention in comparison to a standard CMOS inverter buffer circuit during a L-to-H and a H-to-L transition.

FIG. 3 is a waveform diagram of the output of the buffer circuit 10 at OUT in comparison to a conventional CMOS-based buffer. Waveform 70 represents the signal at IN. Waveform 80 represents the output signal of a conventional CMOS-based buffer that is essentially an inverter. Waveform 90 represents the output signal at OUT of the buffer circuit 10 of FIG. 2. It can be seen that the conventional CMOS buffer output signal 80 switches from H-to-L for a L-to-H input switch at an input potential of about 1.7 V, which is essentially equal to Vcc/2 for Vcc equal to 3.3V. The conventional buffer output signal 80 switches from L-to-H for a H-to-L input switch also at about 1.7V. However, for the buffer circuit 10, it can be seen from an examination of waveform 90 that the switch of the OUT signal from H-to-L occurs when the input signal at IN reaches about 0.8 on a L-to-H transition, something substantially less than Vcc/2 and therefore substantially faster than under the conventional buffer circuit design. The L-to-H switch at OUT at an input potential of about 2.2V, or substantially more than Vcc/2. It can be seen, then, that the buffer circuit 10 provides for faster dynamic switching in both types of transitions. Of course, the circuit 10 can be tailored to define the desired switching threshold potential.

Figure 4:
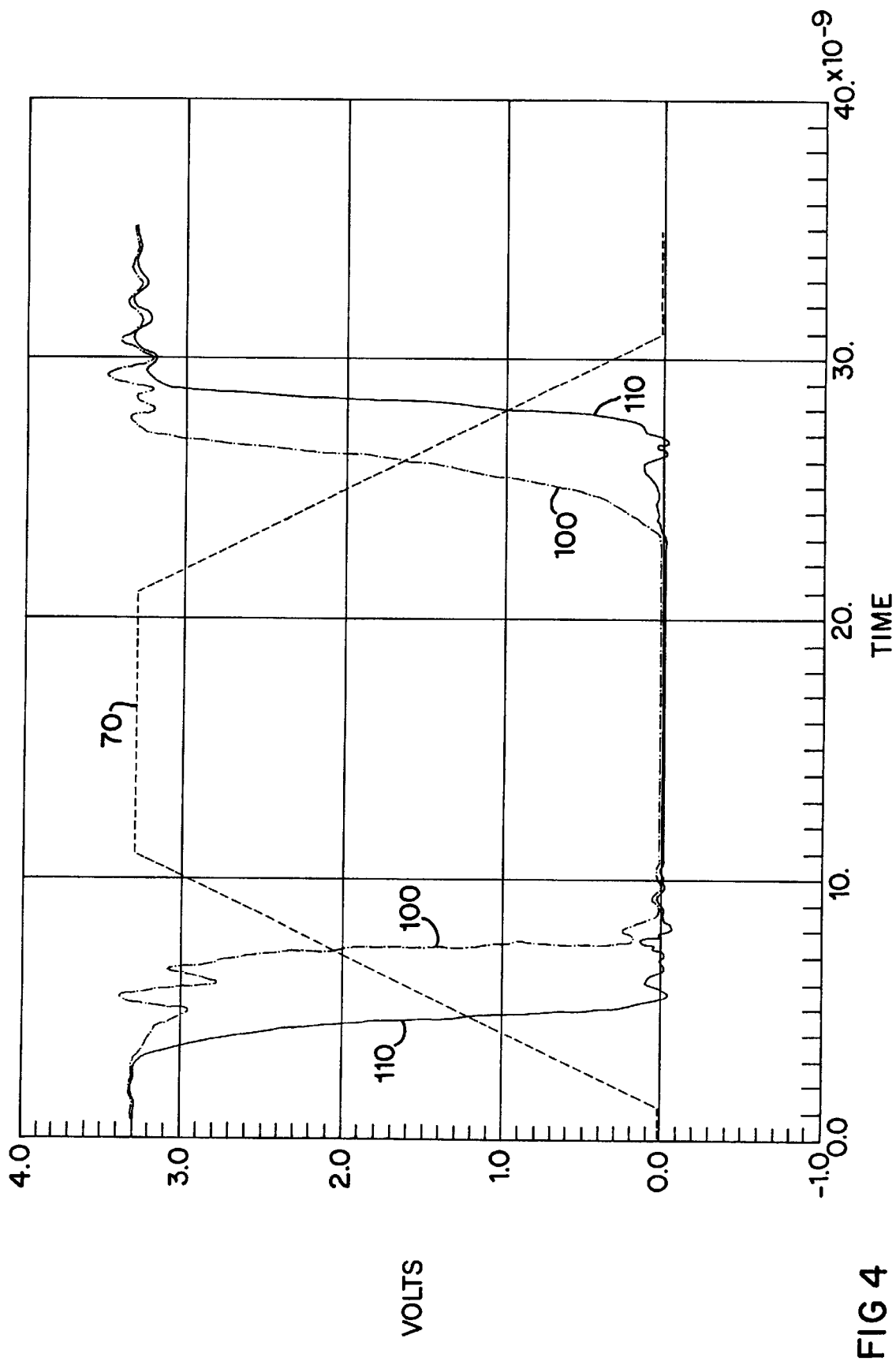
FIG. 4 is a waveform diagram showing the difference in the propagation delays associated with the two input inverters of the input branch of the buffer circuit during a L-to-H and a H-to-L transition.

FIG. 4 illustrates the impact of the respective inverters IV1 and IV2 of FIG. 2 on the output of buffer circuit 10 during H-to-L and L-to-H input signal transitions at IN. Specifically, waveform 100 represents the output of inverter IV1 while waveform 110 represents the output of inverter IV2. In the example described earlier with reference to the operation of the buffer circuit 10 shown in FIG. 2 for a L-to-H transition at IN, inverter IV2 controls as it switches relatively faster than inverter IV1. When a H-to-L transition occurs at IN, inverter IV1 dominates the switching of the buffer circuit 10 such that it is faster to switch from L-to-H. The net effect of the operation of inverters IV1 and IV2 represented by waveforms 100 and 110, respectively, of FIG. 4 is waveform 80 of FIG. 3.

The buffer circuit 10 provides for selectable control of the dynamic threshold associated with buffer switching. While the invention has been described with reference to particular example embodiments, it is intended to cover all modifications and equivalents within the scope of the following claims.

What is claimed is:

1. A buffer circuit having an input node and an output node, the circuit comprising:
   a. an input branch including a first input section with an output and with an input coupled to the input node, and a second input section with an output and with an input coupled to the input node, wherein said first input section has a first switching potential threshold and said second input section has a second switching potential threshold, and wherein said first switching potential threshold is not equal to said second switching potential threshold;
   b. a logic circuit having a first input coupled to said output of said first input section, a second input coupled to said output of said second input section and an output;
   c. a first input controller coupled between said output of said first input section and the output node, wherein said first input controller is coupled to said logic circuit such that said logic circuit enables operation of said first input controller;
   d. a second input controller coupled between said second input section and the output node, wherein said second input controller is coupled to said logic circuit such that said logic circuit enables operation of said second input controller; and
   e. a latch device coupled between said logic circuit and said first input controller and between said logic circuit and said second input controller.

2. The circuit as claimed in claim 1 wherein said first input section is a first inverter and said second input section is a second inverter, wherein said switching potential threshold of said first inverter is skewed to be greater than one-half the potential of a high-potential power rail supplying power to the circuit, and wherein said switching potential threshold of said second inverter is skewed to be less than one-half the potential of said high-potential power rail.

3. The circuit as claimed in claim 2 wherein said first input controller is a first passgate device and said second input controller is a second passgate device.

4. The circuit as claimed in claim 3 wherein said first passgate device includes a first PMOS transistor and a first NMOS transistor coupled in parallel and said second passgate device includes a second PMOS transistor and a second NMOS transistor coupled in parallel.

5. The circuit as claimed in claim 4 wherein said first inverter is a CMOS inverter having an output coupled to an input of said first passgate device and to said first input of said logic circuit and said second inverter is a CMOS inverter having an output coupled to an input of said second passgate device and to said second input of said logic circuit.

6. The circuit as claimed in claim 5 wherein said logic circuit is coupled to said first inverter and to said second inverter such that upon the switching of a signal at the input node, the one of said first passgate device and said second passgate device coupled to the one of said first inverter and said second inverter that switches logic level faster is enabled.

7. The circuit as claimed in claim 6 wherein said logic circuit is coupled to said first inverter and to said second inverter such that upon the switching of a signal at the input node, the one of said first passgate device and said second passgate device coupled to the one of said first inverter and said second inverter that switches logic level slower is enabled.

8. The circuit as claimed in claim 7 wherein said first passgate device and said second passgate device are coupled to enable circuitry of external circuits.

9. A method of providing dynamic threshold control of a buffer circuit having an input node and an output node, the method comprising the steps of:
   a. coupling to the input node a first input section and a second input section, wherein said first input section has a switching potential threshold and said second input section has a switching potential threshold not equal to said switching potential threshold of said first input section;
   b. controlling said first input section with a first input controller;
   c. controlling said second input section with a second input controller;
   d. enabling said first input controller and said second input controller with a logic circuit; and e. coupling a latch device between said logic circuit and said first and second input controllers.

10. The method as claimed in claim 9 wherein said switching potential threshold of said first input section is skewed to be greater than one-half the potential of a high-potential power rail supplying said buffer circuit and said switching potential threshold of said second input section is skewed to be less than one-half the potential of the high-potential power rail.

11. The method as claimed in claim 10 wherein said first input section is a first inverter and said second input section is a second inverter.

12. The method as claimed in claim 11 wherein said first input controller is a first passgate device and said second input controller is a second passgate device.

13. The method as claimed in claim 12 wherein said logic circuit is arranged such that upon a switching of a signal at the input node, the one of said first passgate device and said second passgate device coupled to the one of said first inverter and said second inverter that switches faster is enabled.

* * * * *